United States Patent [19]
Moriizumi

[11] Patent Number: 5,153,441
[45] Date of Patent: Oct. 6, 1992

[54] ELECTRON-BEAM EXPOSURE APPARATUS

[75] Inventor: Koichi Moriizumi, Itami, Japan

[73] Assignee: Mitsubishi Denki Kabushiki Kaisha, Japan

[21] Appl. No.: 617,018

[22] Filed: Nov. 21, 1990

[30] Foreign Application Priority Data

Jun. 26, 1990 [JP] Japan .................. 2-165677

[51] Int. Cl.⁵ .......................... H01J 37/30
[52] U.S. Cl. .................. 250/492.2; 250/398
[58] Field of Search ........... 250/492.22, 492.2 R, 250/492.23, 398

[56] References Cited

U.S. PATENT DOCUMENTS

| | | | |
|---|---|---|---|
| 3,118,050 | 1/1964 | Hetherington | 219/121.25 |
| 4,119,854 | 10/1978 | Tanaka et al. | 250/398 |
| 4,213,053 | 7/1980 | Pfeiffer | 250/492.23 |
| 4,899,060 | 2/1990 | Lischke | 250/505.1 |
| 5,036,209 | 7/1991 | Kataoka et al. | 250/398 |

FOREIGN PATENT DOCUMENTS 61-255022 11/1986 Japan .................. 250/492.2

Primary Examiner—Jack I. Berman
Attorney, Agent, or Firm—Leydig, Voit & Mayer

[57] ABSTRACT

An electron-beam exposure apparatus includes a sample stage for holding a sample, an electron gun, a first aperture for shaping an electron beam emitted from the electron gun, an electro-optical device for causing an electron beam formed by the first aperture to be deflected and to be converged on a sample held on the sample stage, a second aperture in which a plurality of block patterns are formed, for shaping an electron beam from an electro-optical device, and a movement device for moving the second aperture in order to cause an electron beam from the electro-optical device to strike a desired block pattern among a plurality of the block patterns.

8 Claims, 3 Drawing Sheets

ELECTRON-BEAM EXPOSURE APPARATUS

BACKGROUND OF THE INVENTION

1. Field of the Invention The present invention relates to an electron-beam exposure apparatus and, in particular, to a variable shaping type electron-beam exposure apparatus which is capable of a blanket exposure used in the production of semiconductor devices or the like.

2. Description of the Related Art

FIG. 3 shows a schematic construction of a conventional variable shaping type electron-beam exposure apparatus. This exposure apparatus was presented at the 50th Applied Physical Society science lecture meeting. After an electron beam 5; emitted from an electron gun 1, is formed into a rectangular beam in cross section after passing through a first aperture member 2, it is deflected by a beam-shaping deflector 3 and is made to strike a desired block pattern of a second aperture member 4. Further, the electron beam 5 which has passed through the second aperture member 4 is projected on a desired position of a sample 9 placed on an X-Y stage 10 by means of a beam position deflector 8, causing the block pattern to be exposed to light. Numerals 6 and 7 denote electromagnetic lenses for causing the electron beam 5 to converge.

The first aperture member 2 has one rectangular pattern 2a in the center, as shown in FIG. 4. Meanwhile, in the second aperture member 4 are formed a plurality of block patterns 4a to 4e consisting of one or more figures, as shown in FIG. 5.

When the exposure of one block pattern out of the block patterns of the second aperture member 4 in the above way is terminated, this time the electron beam 5 is deflected by the beam shaping deflector 3 and is made to strike the next block pattern. Further, the electron beam 5 which has passed through this block pattern is projected in the desired position on the sample 9 by means of the beam position deflector 8.

The beam position deflector 8 can usually deflect the electron beam 5 only in an area of approximately 2 mm square on the surface of the sample 9. Therefore, by moving the X-Y stage 10, exposure can be performed over the entire surface of the sample 9.

However, in exposing a block pattern formed on the peripheral edge of the second aperture member 4, the electron beam 5 must be deflected greatly by the beam shaping deflector 3, as shown in FIG. 3. If the electron beam 5 is deflected greatly in this manner, since the electron beam 5 passes through the peripheral edge of the electromagnetic lens 7, a problem will arise in that various aberrations will occur and pattern exposure with a high degree of accuracy is difficult to effect.

Also, if an attempt is made to suppress aberration caused by the electromagnetic lens 7, it is necessary to diminish the amount of the deflection of the electron beam 5. As a result, a problem will arise in that the number of block patterns which can be formed in the second aperture 4 is limited.

SUMMARY OF THE INVENTION

The present invention has been devised to eliminate the above-described problems. An object of the present invention is to provide an electron-beam exposure apparatus capable of exposing with high accuracy using a large number of block patterns formed in the second aperture.

The electron-beam exposure apparatus of the present invention comprises a sample stage for holding a sample, an electron gun, a first aperture for shaping an electron beam emitted from the electron gun, an electro-optical device for causing an electron beam formed by the first aperture to be deflected and to converge on a sample held on the sample stage, a second aperture in which a plurality of block patterns are formed, for shaping an electron beam from an electro-optical device, and a movement device for moving the second aperture in order to cause an electron beam from the electro-optical device to strike a desired block pattern among a plurality of the block patterns.

These and other objects, features and advantages of the present invention will become clear when reference is made to the following description of the preferred embodiments of the present invention, together with reference to the accompanying drawings.

DESCRIPTION OF THE PREFERRED EMBODIMENTS

The embodiments of the present invention will be explained hereinunder with reference to the accompanying drawings.

Figure 1:
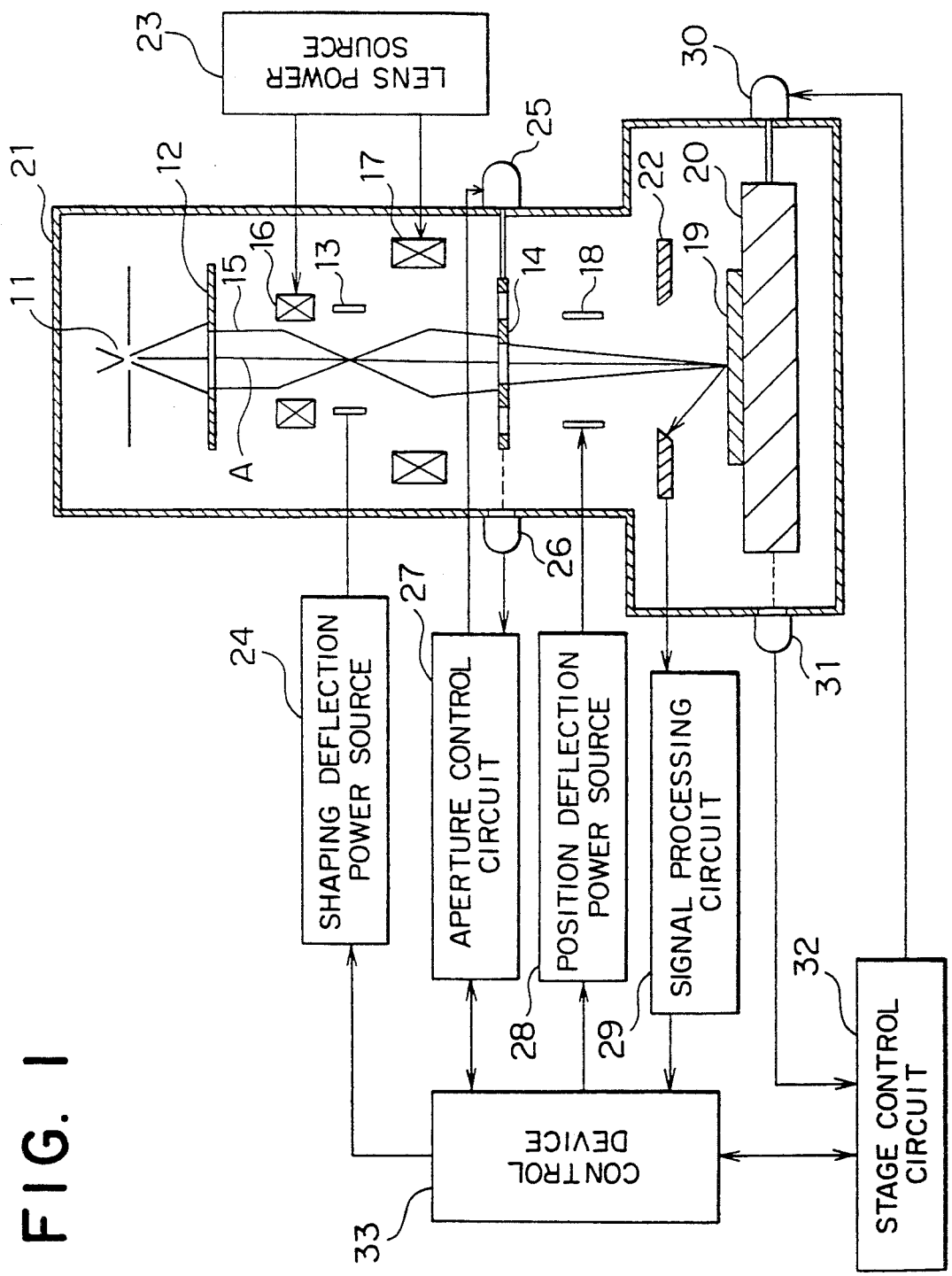
FIG. 1 is a block diagram illustrating the construction of an electron-beam exposure apparatus in accordance with one embodiment of the present invention.

In FIG. 1, in an electron-beam exposure apparatus in one embodiment of the present invention, an electron gun 11 for generating an electron beam 15 is disposed in the topmost section of a lens barrel 21 and a first aperture member 12 is fixed below the electron gun 11. A second aperture 14 is disposed below the first aperture member 12 via an electromagnetic lens 16, a beam shaping deflection electrode 13, and an electromagnetic lens 17. Further, an X-Y stage 20 is disposed below the second aperture member 14 via a beam position deflection electrode 18 and an electronic detector 22. The above members constitute an electro-optical system.

A lens power source 23 for causing a current to flow through the electromagnetic lenses 16 and 17 in order to converge the electron beam 15 is connected to these lenses. A shaping deflection power source 24 is connected to the beam shaping deflection electrode 13.

The second aperture member 14 is disposed in the plane perpendicular to the center axis A of the electro-optical system and is capable of moving in this perpendicular plane by means of a movement device 25 disposed on the lens barrel 21. An aperture position detector 26 for detecting the position of the second aperture member 14 with high accuracy is disposed on the lens barrel 21. An aperture control circuit 27 is connected to the aperture position detector 26 and the movement device 25.

A position deflection power source 28 is connected to the beam position deflection electrode 18, and a signal processing circuit 29 is connected to the electronic detector 22. The X-Y stage 20 is capable of moving in a plane perpendicular to the center axis A of the electro-optical system by means of a movement device 30 disposed on the lens barrel 21.

A stage position detector 31 for detecting the position of the X-Y stage 20 with high accuracy is disposed on the lens barrel 21, and a stage control circuit 32 is connected to the detector 31 and the movement device 30. Further, a control device 33 is connected to the shaping deflection power source 24, the aperture control circuit 27, the position deflection power source 28, the signal processing circuit 29, and the stage control circuit 32.

Figure 2:
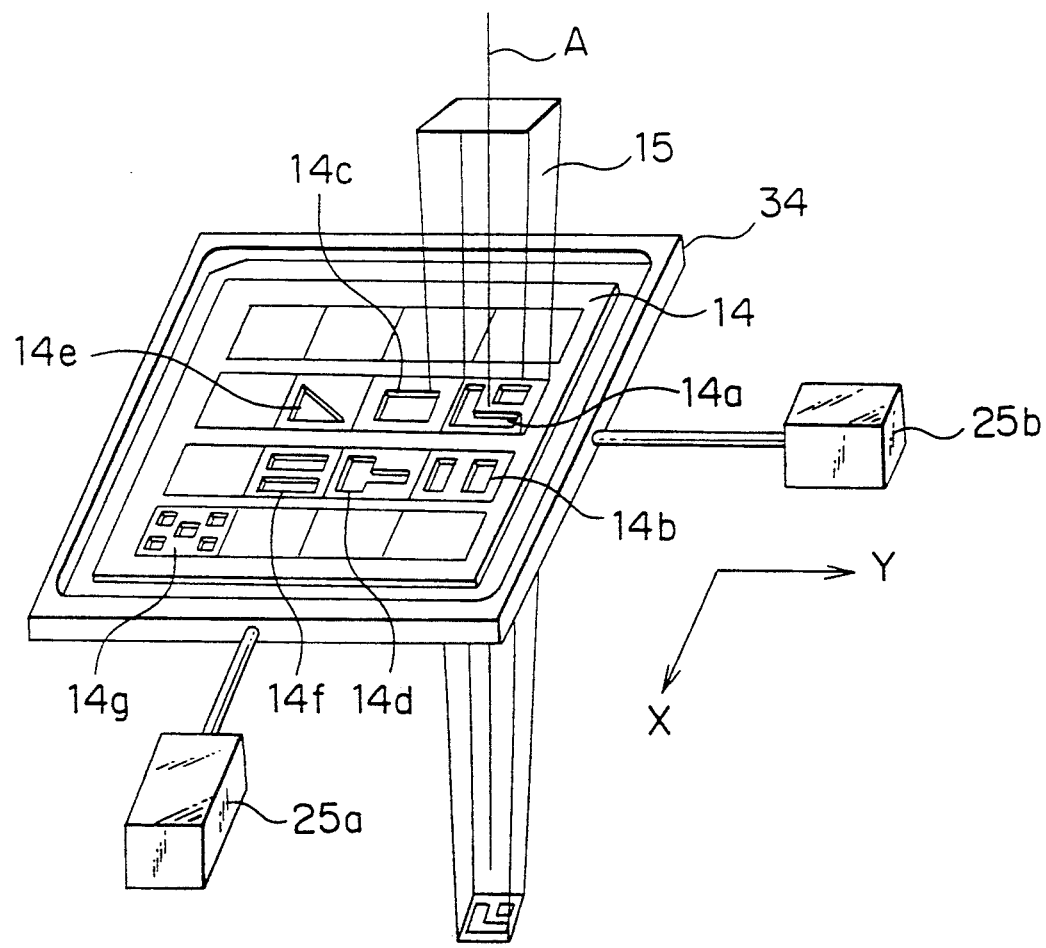
FIG. 2 is an enlarged perspective view illustrating an essential portion of the embodiment.
Figure 3:
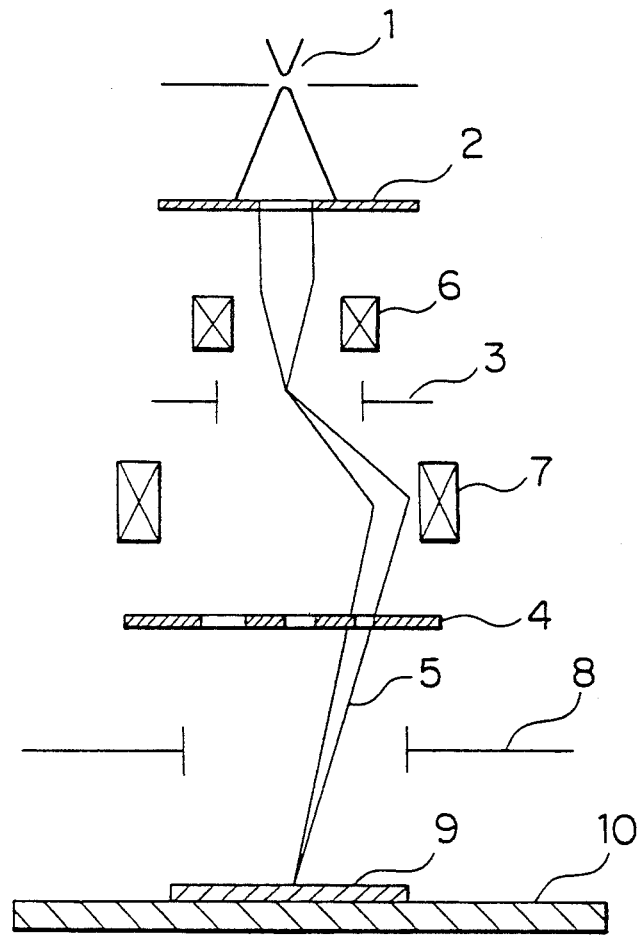
FIG. 3 is a cross sectional view illustrating a conventional exposure apparatus.
Figure 4:
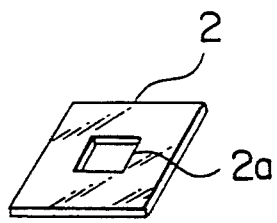
FIGS. 4 and 5 are each perspective views illustrating the first and second apertures used in the aperture member in FIG. 3.
Figure 5:
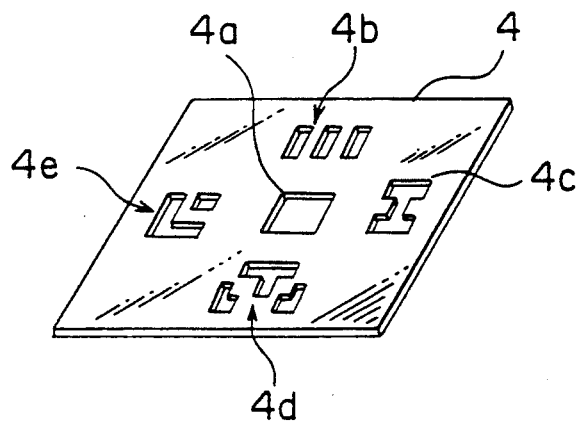

The first aperture member 12 has one rectangular pattern in the center in the same manner as the first aperture 2 of the conventional apparatus shown in FIG. 4. As shown in FIG. 2, the second aperture member 14 has a plurality of block patterns 14a to 14g each consisting of one or more figures and is disposed on a movable stage 34. The movable stage 34 is disposed in such a manner as to be movable in the X-Y direction by means of motors 25a and 25b having high accuracy such as a DC survo motor constituting the movement device 25. To the lens barrel 21 a vacuum apparatus (not shown) is connected to attain a vacuum state on the inside of the barrel.

Next, the operation of this embodiment will be explained. First, the required second aperture member 14 is held on the movable stage 34, and a sample 19 such as a semiconductor substrate is placed on the X-Y stage 20. Then, the inside of the lens barrel 21 is evacuated to a vacuum by means of an unillustrated vacuum apparatus. The alignment of the sample 19 is performed in this state. For example, an electron beam 15 is emitted from the electron gun 11, and this electron beam 15 is made to converge by means of the electromagnetic lenses 16 and 17 so that it will strike an alignment mark formed on the surface of the sample 19. Electrons reflected from the sample 19 are detected by the electronic detector 22 and it is determined whether or not the alignment mark is irradiated with the electron beam 15 by processing a detection signal by the signal processing circuit 29. Where the electron beam 15 deviates from the alignment mark, the movement device 30 is driven via the control device 33 and the stage control circuit 32 and the sample 19 is moved along with the movement device 30 so that the electron beam 15 is aligned with the alignment mark.

Next, the movement device 25 is driven by the aperture control circuit 27 while confirming the position of the second aperture member 14 by means of the aperture position detector 26, with the result that the second aperture member 14 is moved and a block pattern 14a which it is desired to use at first is positioned on the center axis A of the electro-optical system as shown in FIG. 2. Meanwhile, the movement device 30 is driven by the stage control circuit 32 while confirming the position of the X-Y stage 20 by means of the stage position detector 31, with the result that the sample 19 is moved so that the desired position of the sample 19 is moved onto the center axis A of the electro-optical system. If the electron beam 15 is emitted from the electron gun 11 in this state, the electron beam 15 is formed into a rectangular in cross section after passing through the first aperture member 12, then is made to strike the block pattern 14a. The electron beam 15 which has passed through the second aperture member 14 is projected on the surface of the sample 19 placed on the movement device 30, thus exposing the block pattern 14a.

Thereafter, the electron beam 15 is deflected by applying a voltage to the beam position deflection electrode 18 from the position deflection power source 28 and the same block pattern 14a is exposed as required in an area of approximately 2 mm square on the surface of the sample 19.

When the exposure of one block pattern 14a is terminated as described above, the control device 33 causes the movement device 25 to be driven via the aperture control circuit 27 and causes the second aperture member 14 to move so that the block pattern 14b which it is desired to use next is positioned on the center axis A of the electro-optical system. The exposure using the block pattern 14b is performed in the same manner as that using the block pattern 14a.

A voltage is applied to the beam shaping deflection electrode 13 from the shaping deflection power source 24, as required to deflect the electron beam 15. The exposure of a rectangular pattern of a desired size is performed by varying the degree in which the electron beam 15 overlaps the block patterns of the second aperture member 14.

When the exposure of an area of approximately 2 mm square on the surface of the sample 19 is terminated in the above way, the control device 33 causes the movement device 30 to be driven via the stage control circuit 32 and causes the X-Y stage 20 to move so that the next area on the sample 19 is positioned on the center axis A of the electro-optical system. A similar exposure is performed using each of the block patterns 14a to 14g of the second aperture 14.

As has been explained above, according to the present invention, an exposure over the entire surface of the sample 19 can be performed using a great number of block patterns 14a to 14g formed in the second aperture member 14. That is, pattern exposure with a high degree of accuracy is made possible without causing various aberrations in consequence of a great deflection of the electron beam 15.

The aperture position detector 26 and the stage position detector 31 may be formed, for instance, from a laser interferometer. In one embodiment of the invention shown in FIG. 1, a laser interferometer is used to determine the position of the aperture 26—forming an aperture position detector, and a second laser interferometer is used to determine the position of the sample 31 —forming a sample position detector.

Many widely different embodiments of the present invention can be made without departing from the spirit and scope thereof, therefore, it is to be understood that this invention is not limited to the specific embodiments thereof except as defined in the appended claims.

What is claimed is:

1. A variable shaping type electron-beam exposure apparatus, comprising:
   a sample stage for holding a sample;
   an electron gun;
   a first aperture member including a first aperture for shaping an electron beam emitted along an axis from said electron gun;
   electro-optical means for causing an electron beam formed by the first aperture to be deflected and converged on a sample held on said sample stage;
   a second aperture member having a plurality of block patterns for forming an electron beam from said electro-optical means each of the block patterns being provided by a distinct opening in said second aperture member;

movement means for moving said second aperture member in order to cause an electron beam from said electro-optical means to strike a desired block pattern among the plurality of block patterns, wherein the desired block pattern is selected by moving the second aperture in a direction perpendicular to the axis and by aligning the block pattern with the axis, the axis being perpendicular to a face of the second aperture, and wherein the movement means including a pair of high accuracy servomotors; and electronic control means for controlling said movement means.

2. An electron-beam exposure apparatus as claimed in claim 1, wherein said electro-optical means includes an electromagnetic lens, a beam-shaping deflection electrode, a lens power source for supplying a power source to said electromagnetic lens, and a shaping deflection power source for supplying a power source to said beam shaping deflection electrode.

3. An electron-beam exposure apparatus as claimed in claim 1, wherein said sample stage is an X-Y stage which is movable in a direction perpendicular to the electron beam axis.

4. An electron-beam exposure apparatus as claimed in claim 1, further comprising:

an aperture position detector for detecting the position of said second aperture member;

a sample position detector for detecting the position of said sample; and control means for controlling said electro-optical means and said movement means on the basis of the positions of said second aperture member and said sample which are respectively detected by means of said aperture position detector and said sample position detector and for causing a desired pattern to be exposed onto said sample by using a plurality of block patterns of said second aperture member.

5. An electron-beam exposure apparatus as claimed in claim 4, wherein said aperture position detector comprises a first laser interferometer, and said sample position detector comprises a second laser interferometer.

6. An electron-beam exposure apparatus as claimed in claim 4, further comprising:

a beam position deflection electrode for varying the position at which an electron beam is made to strike said sample by deflecting an electron beam formed by a block pattern of said second aperture member; and a position deflection power source connected to said control means, for supplying a power source to said beam position deflection electrode.

7. An electron beam exposure apparatus as recited in claim 4, including an evacuated lens barrel containing the sample, the second aperture, the aperture position detector, and the sample position detector, wherein the sample position detector and the aperture position detector are mounted on the lens barrel.

8. A variable shaping type electron-beam exposure apparatus, comprising:

a sample stage for holding a sample;

an electron gun;

a first aperture member including a first aperture for shaping an electron beam emitted along an axis from said electron gun;

electro-optical means for causing an electron beam formed by the first aperture to be deflected and converged on a sample held on said sample stage;

a second aperture member having a plurality of block patterns for forming an electron beam from said electro-optical means each of the block patterns being provided by a distinct opening in said second aperture member;

movement means for moving said second aperture member in order to cause an electron beam from said electro-optical means to strike a desired block pattern among the plurality of block patterns, wherein exposure of a varying size pattern is performed by varying the degree in which the electron beam emitted along the axis overlaps the desired block pattern, and wherein the movement means includes a pair of high accuracy servomotors for causing said second aperture to move in a direction perpendicular to the axis, the center of the block pattern being offset from the axis so that the electron beam covers only a portion of the block pattern; and electronic control means for controlling said movement means.

* * * * *